United States Patent
Endo et al.

(10) Patent No.: US 10,249,775 B2
(45) Date of Patent: *Apr. 2, 2019

(54) SOLAR CELL AND METHOD FOR PRODUCING SOLAR CELL

(71) Applicant: SHIN-ETSU CHEMICAL CO., LTD., Tokyo (JP)

(72) Inventors: Yoko Endo, Takasaki (JP); Takenori Watabe, Annaka (JP); Hiroyuki Otsuka, Karuizawa-machi (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/315,520

(22) PCT Filed: Apr. 7, 2015

(86) PCT No.: PCT/JP2015/001954
§ 371 (c)(1),
(2) Date: Dec. 1, 2016

(87) PCT Pub. No.: WO2015/190024
PCT Pub. Date: Dec. 17, 2015

(65) Prior Publication Data
US 2017/0186894 A1    Jun. 29, 2017

(30) Foreign Application Priority Data
Jun. 11, 2014   (JP) .................................. 2014-120283

(51) Int. Cl.
*H01L 31/0224* (2006.01)
*H01L 21/28* (2006.01)
(Continued)

(52) U.S. Cl.
CPC ...... *H01L 31/022458* (2013.01); *H01L 21/28* (2013.01); *H01L 31/0201* (2013.01);
(Continued)

(58) Field of Classification Search
CPC .................... H01L 31/0201; H01L 31/022441
See application file for complete search history.

(56) References Cited

U.S. PATENT DOCUMENTS 8,435,842 B2   5/2013   Hirano et al.
9,799,782 B2   10/2017  Kim et al.
(Continued)

FOREIGN PATENT DOCUMENTS

CN   101395722 A   3/2009
EP   2009701 A1    12/2008
(Continued)

OTHER PUBLICATIONS

Jun. 16, 2015 International Search Report issued in International Patent Application No. PCT/JP2015/001954.
(Continued)

*Primary Examiner* — Eli S Mekhlin
(74) *Attorney, Agent, or Firm* — Oliff PLC

(57) ABSTRACT

A solar cell includes: first and second conductivity type diffusion layers which are formed on a backside of a light-receiving surface of a substrate, first and second electrode portions, first and second electrode line portions, and first and a second electrode bus bar portions; a first insulator film which is formed to cover a side portion and a top of the second electrode portion in an intersection region of the second electrode portion and the first electrode bus bar portion, a second insulator film which is formed to cover a side portion and a top of the first electrode portion in an intersection region of the first electrode portion and the second electrode bus bar portion, wherein the second elec-
(Continued)

trode portion is formed continuously in a line shape under the first insulator film, and the first electrode portion is formed continuously in a line shape under the second insulator film.

21 Claims, 10 Drawing Sheets

(51) Int. Cl.
- *H01L 31/068* (2012.01)
- *H01L 31/02* (2006.01)
- *H01L 31/0216* (2014.01)
- *H01L 31/0236* (2006.01)

(52) U.S. Cl.
CPC .... *H01L 31/0224* (2013.01); *H01L 31/02167* (2013.01); *H01L 31/02366* (2013.01); *H01L 31/068* (2013.01); *Y02E 10/50* (2013.01)

(56) References Cited

U.S. PATENT DOCUMENTS

| | | | |
|---|---|---|---|
| 2005/0115602 A1* | 6/2005 | Senta | H01L 31/035281 136/250 |
| 2006/0130891 A1 | 6/2006 | Carlson | |
| 2008/0223437 A1 | 9/2008 | De Ceuster | |
| 2009/0126788 A1 | 5/2009 | Hishida et al. | |
| 2010/0116310 A1 | 5/2010 | Shimizu et al. | |
| 2010/0243028 A1 | 9/2010 | Sainoo et al. | |
| 2010/0261321 A1* | 10/2010 | Hirano | H01L 51/0097 438/158 |
| 2011/0041908 A1 | 2/2011 | Harder | |
| 2011/0120530 A1 | 5/2011 | Isaka | |
| 2013/0112233 A1 | 5/2013 | Coakley | |
| 2013/0160825 A1* | 6/2013 | Lantzer | H01L 31/0516 136/251 |
| 2014/0069498 A1 | 3/2014 | Cho et al. | |
| 2014/0352753 A1* | 12/2014 | Degroot | H01L 31/0504 136/244 |
| 2015/0090317 A1 | 4/2015 | Tokuoka et al. | |
| 2015/0114454 A1* | 4/2015 | Kim | H01L 31/0508 136/251 |
| 2015/0243818 A1* | 8/2015 | Kim | H01L 31/0516 136/244 |

FOREIGN PATENT DOCUMENTS

| | | |
|---|---|---|
| JP | 2008-519438 A | 6/2008 |
| JP | 2009-206366 A | 9/2009 |
| JP | 2011-003724 A | 1/2011 |
| JP | 2011-507245 A | 3/2011 |
| JP | 2011-134999 A | 7/2011 |
| JP | 2012-109626 A | 6/2012 |
| JP | 5093821 B2 | 12/2012 |
| JP | 5214755 B2 | 6/2013 |
| JP | 5317209 B2 | 10/2013 |
| JP | 2014-075532 A | 4/2014 |
| TW | 200834947 A | 8/2008 |
| TW | 201121072 A | 6/2011 |
| TW | 201248893 A | 12/2012 |
| WO | 2014/002249 A1 | 1/2014 |

OTHER PUBLICATIONS

Sep. 1, 2015 International Search Report issued in International Patent Application No. PCT/JP2015/003326.
Sep. 21, 2017 Office Action issued in U.S. Appl. No. 15/503,894.
Dec. 15, 2017 Extended European Search Report issued in European Patent Application No. 15807525.9.
Aug. 3, 2017 Office Action issued in Chinese Application No. 201580030808.7.
Jan. 24, 2018 Office Action issued in U.S. Appl. No. 15/503,894.
Aug. 10, 2018 Office Action issued in Taiwanese Application No. 104118945.
Jul. 4, 2018 Office Action issued in Chinese Patent Application No. 201580030808.7.
Jan. 11, 2019 Office Action issued in Filipino Patent Application No. 1/2016/502437.
Oct. 30, 2018 Office Action issued in Taiwanese Patent Application No. 104118945.
Nov. 30, 2018 Office Action issued in Chinese Patent Application No. 201580030808.7.

* cited by examiner

SOLAR CELL AND METHOD FOR PRODUCING SOLAR CELL

TECHNICAL FIELD

The present invention relates to a solar cell and a method for producing a solar cell.

BACKGROUND ART

A previous back surface electrode-type solar cell is schematically shown in FIG. 15 as a cross sectional view. The back surface electrode-type solar cell 110 produced by a previous art will be described by referring to FIG. 15. On the light-receiving surface side of an N-type silicon substrate 113, a rugged shape 114 and an FSF (Front Surface Field) layer 115, which is an N-type diffusion layer, are formed. On the rugged shape 114, a dielectric passivation layer (a surface passivation layer) 117 which contains silicon dioxide and an antireflective film 116 which contains silicon nitride are formed from the side of the N-type diffusion layer 113.

On the backside of the N-type silicon substrate 113, an oxide layer (the first backside passivation film) 119 is formed. In addition, on the backside of the N-type silicon substrate 113, N-type doped N-type diffusion layers 120 and P-type doped P-type diffusion layers 121 are alternately formed. On the N-type diffusion layer 120, an N-type metal contact 11 is formed; and on the P-type diffusion layer 121, a P-type metal contact 12 is formed. These contact electrodes, which are joined directly to the substrate itself, can function as finger electrodes for collecting current.

FIG. 19 is a top view schematically showing the appearance of the backside of the previous back surface electrode-type solar cell. As shown in FIG. 19, the back surface electrode-type solar cell is provided with a pair of bus bar electrodes (an N-type bus bar electrode 22, a P-type bus bar electrode 23) at the edge of the substrate for collecting current from finger electrodes (the N-type metal contact 11, the P-type metal contact 12). Although the electrodes nearest to the periphery of the substrate are depicted as N-type metal contact electrodes in FIG. 19, they may be P-type metal contact electrodes or electrodes of different type with each being P-type and N-type.

To improve the efficiency of the back surface electrode-type solar cell, full enlargement of the P-type diffusion layer, which is a power generation layer, can be expected to increase short circuit current. Accordingly, it is desirable to form the region of the P-type diffusion layer widely such as the ratio of the P-type diffusion layer and the N-type diffusion layer in a range of 80:20 to 90:10. When the area of contact between the substrate and the contact electrodes (hereinafter, also referred to as contact area) is decreased as possible, and the passivation regions are enlarged, increase of open circuit voltage can be expected. Accordingly, it is desirable to design the metal contact region as small as possible by making the contact electrodes in thin line shapes or dot shapes.

Patent Literature 1 discloses a back surface electrode-type solar cell in which the contact area of the electrodes and the substrate is suppressed to the lowest possible, and the passivation regions are enlarged by three steps of forming contact electrodes, covering the portion other than the contact electrodes with an insulation film, and forming a wiring electrode.

FIG. 16 is a top view schematically showing the appearance of the backside of the previous back surface electrode-type solar cell disclosed in Patent Literature 1. In the solar cell of Patent Literature 1, however, only one pair of bus bar electrodes (an N-type bus bar electrode 22, a P-type bus bar electrode 23) are formed at the periphery of the substrate (see FIG. 16). In this arrangement, the finger electrodes are long, and accordingly the wiring resistance becomes extremely large, which causes lowering of a fill factor. It is considered that this can be solved by designing the wiring electrodes (finger electrodes) to have enlarged cross-section or the finger to have shortened length.

FIG. 17 is a top view schematically showing the appearance of the backside of the previous back surface electrode-type solar cell disclosed in Patent Literature 2. As shown in FIG. 17, Patent Literature 2 discloses an electrode shape of a solar cell, for example, being provided with plural pairs of bus bar electrodes 30 so as to shorten the length of finger electrodes 41. In this arrangement, the finger length becomes L/3 based on the substrate length L, and the wiring resistance becomes one third compared to the case having a pair of bus bar electrodes. In this case, however, the bus bar electrodes are arranged at the periphery, and the bus bar electrodes at the periphery only collect current from the finger electrode on one side.

CITATION LIST

Patent Literature

Patent Literature 1: Japanese Patent No. 5317209
Patent Literature 2: Japanese Patent No. 5214755

SUMMARY OF INVENTION

Technical Problem

Accordingly, the inventors attempted to improve the pattern of bus bar electrodes. FIG. 18 is a top view schematically showing the appearance of the backside of a back surface electrode-type solar cell in which the positions of bus bar electrodes are altered. For example, when the bus bar electrodes (an N-type bus bar electrode 22, a P-type bus bar electrode 23) are rearranged to be formed inside in order to collect current from the finger electrodes (N-type finger electrodes 39, P-type finger electrodes 40) on both sides, and insulator films 124 and 125 are installed as shown in FIG. 18 so as not to touch the finger electrodes and the bus bar electrodes for different conductivity type with each other, it is possible to decrease the finger length to L/6 without altering the number of bus bar electrodes, and to decrease the wiring resistance to one sixth of that of a pair of bus bar electrodes.

On the other hand, in view of improving the efficiency of a solar cell, it is necessary to narrow the line width of the contact electrodes which directly joined to the substrate, or to make the contact electrodes discontinuous to thin out the electrode in order to decrease the contact area. FIGS. 20 and 21 are figures to show steps of forming electrodes of a back surface electrode-type solar cell which was investigated by the present inventors.

For example, when the line width of contact electrodes 28 is narrowed, the steps shown in FIG. 20 can be performed by forming the contact electrodes 28 (FIG. 20 (1)), followed by installing insulator films 124 in regions in which bus bar electrodes for different conductivity type are intersect (FIG. 20 (2)), and forming bus bar electrodes 30 (FIG. 20 (3)). In this case, only contact electrodes with narrow line width function as finger electrodes for collecting current. Accordingly, the finger electrode becomes thinner, that is, the cross-section of the finger electrode becomes smaller. As a result, the wiring resistance increases, thereby lowering the conversion efficiency.

In order to decrease the contact area, the contact electrodes 28 may be formed discontinuously in dot shapes as shown in FIG. 21. This case can be performed by forming the contact electrodes 28 discontinuously in dot shapes (FIG. 21 (1)), followed by forming other wiring electrodes 29 to connect these electrodes (FIG. 21 (2)), installing insulator films 124 in regions in which bus bar electrodes with different conductivity type intersect (FIG. 21 (3)), and forming bus bar electrodes 30 (FIG. 21 (4)). In this case, however, a step of forming wiring electrodes 29 is necessary as described above, and accordingly, the number of steps is increased and cost becomes higher.

The present invention was accomplished in view of the above-described problems. It is an object of the present invention to provide a solar cell with low wiring resistance and high conversion efficiency, and to provide a method for producing a solar cell which can produce such a solar cell with low cost.

Solution to Problem

To solve the problems described above, the present invention provides a solar cell comprising:
  a semiconductor substrate of a first conductivity type having a first conductivity type diffusion layer and a second conductivity type diffusion layer which are formed on a backside of a light-receiving surface of the semiconductor substrate,
  a first electrode portion joined to the first conductivity type diffusion layer, and a second electrode portion joined to the second conductivity type diffusion layer,
  a first electrode line portion formed on the first electrode portion,
  a second electrode line portion formed on the second electrode portion,
  a first electrode bus bar portion connected with the first electrode line portion, and
  a second electrode bus bar portion connected with the second electrode line portion;
  a first insulator film which is formed so as to cover a side portion and a top of the second electrode portion at least in an intersection region of the second electrode portion and the first electrode bus bar portion,
  a second insulator film which is formed so as to cover a side portion and a top of the first electrode portion at least in an intersection region of the first electrode portion and the second electrode bus bar portion, wherein
  the second electrode portion is formed continuously in a line shape under the first insulator film, and
  the first electrode portion is formed continuously in a line shape under the second insulator film.

Such a solar cell can shorten the length of the finger electrodes by installing insulator films at least in an intersection region of the second electrode portion and the first electrode bus bar portion and an intersection region of the first electrode portion and the second electrode bus bar portion (hereinafter, referred to as insulation regions), and forming three-dimensional structure of bus bar electrodes and finger electrodes; and accordingly can collect current from the finger electrodes on both sides. As a result, it is possible to decrease the wiring resistance and to increase the fill factor. It is also possible to increase the cross-section of the finger electrode while decreasing the contact area to decrease the wiring resistance by forming finger electrodes on the contact electrodes. Such a solar cell achieves low price, low wiring resistance, and high conversion efficiency. It is to be noted that, hereinafter, the first electrode portion and the second electrode portion are also simply referred to as an electrode portion or a contact electrode when they do not have to be distinguished. Hereinafter, the first electrode line portion and the second electrode line portion are also simply referred to as an electrode line portion or a finger electrode when they do not have to be distinguished. The first electrode bus bar portion and the second electrode bus bar portion are also simply referred to as an electrode bus bar portion or a bus bar electrode.

It is also preferable that the first electrode portion have a dot shape, a line shape, or a combination thereof in a part where the second insulator film is not formed; and the second electrode portion have a dot shape, a line shape, or a combination thereof in a part where the first insulator film is not formed;
  the first electrode portion formed under the second insulator film have a length larger than a length of the second insulator film, and have a width narrower than a width of the second insulator film; and
  the second electrode portion formed under the first insulator film have a length larger than a length of the first insulator film, and have a width narrower than a width of the first insulator film.

In such a solar cell, the area of contact between the electrode portions and the substrate (contact area) can be smaller. It is also possible to further prevent the contact between the electrode portion and the electrode bus bar portion for different conductivity type.

It is also preferable that the first insulator film be formed so as to cover the second conductivity type diffusion layer at least in a region under the first electrode bus bar portion, and
  the second insulator film be formed so as to cover the first conductivity type diffusion layer at least in a region under the second electrode bus bar portion.

In a solar cell having a dielectric layer on the back surface of the substrate, it is preferable to form insulator films as described above. When the insulator film is larger than the width of the diffusion layer, the first electrode bus bar portion does not touch to the second conductivity type diffusion layer, and accordingly the first electrode bus bar portion and the second conductivity type diffusion layer are not electrically conducted with each other via the dielectric layer.

It is also preferable that the total number of the first electrode bus bar portion and the second electrode bus bar portion be 4 or more and 10 or less.

Such a solar cell can further decrease the wiring resistance of the finger electrode.

It is also preferable that the first insulator film and the second insulator film be each composed of a material which at least contains one or more resins selected from the group consisting of silicone resins, polyimide resins, polyamide-imide resins, fluororesins, phenolic resins, melamine resins, urea resins, polyurethanes, epoxy resins, acrylic resins, polyester resins, and poval resins.

Insulator films composed of such material has excellent heat resistivity. Accordingly, these insulator films are preferable when heat treatment is performed in forming an electrode.

It is also preferable that the second electrode portion have a length of 0.35 to 5.0 mm, the first insulator film has a length of 0.32 to 4.0 mm, and the first electrode bus bar portion have a width of 0.30 to 3.0 mm in the intersection region of the second electrode portion and the first electrode bus bar portion;

the first electrode portion have a length of 0.35 to 5.0 mm, the second insulator film has a length of 0.32 to 4.0 mm, and the second electrode bus bar portion have a width of 0.30 to 3.0 mm in the intersection region of the first electrode portion and the second electrode bus bar portion.

In such a solar cell, it is possible to further prevent the contact between the electrode portions and the electrode bus bar portions for different conductivity type.

It is also preferable that the first electrode bus bar portion have a length of 0.3 mm or more, the first insulator film have a width of 0.03 to 1.5 mm, and the second electrode portion have a width of 0.02 to 0.20 mm in the intersection region of the second electrode portion and the first electrode bus bar portion;

the second electrode bus bar portion have a length of 0.3 mm or more, the second insulator film have a width of 0.03 to 1.5 mm, and the first electrode portion have a width of 0.02 to 0.20 mm in the intersection region of the first electrode portion and the second electrode bus bar portion.

Such a solar cell makes the ratio of the area of the electrode to the area of the substrate be in an appropriate range. This makes it possible to enlarge the passivation region and to increase the open-circuit voltage.

It is also preferable that the first insulator film and the second insulator film each have a thickness of 1 to 60 μm.

In such a solar cell, the insulation property can be more improved. It is also possible to produce a desired solar cell at lower cost since it does not form the insulator film excessively.

It is also preferable that the first electrode line portion, the second electrode line portion, the first electrode bus bar portion, and the second electrode bus bar portion be each composed of a material which at least contains one or more kinds of conductive materials selected from the group consisting of Ag, Cu, Au, Al, Zn, In, Sn, Bi, and Pb, and one or more kinds of resins selected from the group consisting of epoxy resins, acrylic resins, polyester resins, phenolic resins, and silicone resins.

When the solar cell is composed of such an electrode material, this electrode material does not directly connected to a semiconductor substrate such as a silicon substrate when it is heated, and an increase of the contact area can be suppressed accordingly.

The present invention also provide a method for producing a solar cell including a semiconductor substrate of a first conductivity type having a first conductivity type diffusion layer and a second conductivity type diffusion layer which are formed on a backside of a light-receiving surface of the semiconductor substrate, comprising the steps of:

forming the first conductivity type diffusion layer and a first electrode portion which is joined to the first conductivity type diffusion layer, as well as the second conductivity type diffusion layer and a second electrode portion which is joined to the second conductivity type diffusion layer, on the backside of the light-receiving surface;

forming a first insulator film so as to cover a side portion and a top of the second electrode portion, and forming a second insulator film so as to cover a side portion and a top of the first electrode portion;

forming a first electrode line portion on the first electrode portion and forming a first electrode bus bar portion so as to connect to the first electrode line portion, simultaneously with forming a second electrode line portion on the second electrode portion and forming a second electrode bus bar portion so as to connect to the second electrode line portion; wherein the second electrode portion is formed continuously in a line shape under the first insulator film, and the first electrode portion is formed continuously in a line shape under the second insulator film in the step of forming the electrode portions; and the first insulator film is formed at least in an intersection region of the second electrode portion and the first electrode bus bar portion, and the second insulator film is formed at least in an intersection region of the first electrode portion and the second electrode bus bar portion in the step of forming the insulator films.

Such a method for producing a solar cell can produce a back surface electrode-type solar cell with low wiring resistance and high conversion efficiency at low cost and with high productivity.

Advantageous Effects of Invention

In the inventive solar cell, it is possible to increase the number of bus bar electrodes and to shorten the length of finger electrodes, and is possible to collect current from the finger electrodes on both sides by installing insulator films at insulation regions and forming three-dimensional structure of the bus bar electrodes and the finger electrodes. As a result, it is possible to decrease the wiring resistance and to increase the fill factor. Moreover, it is possible to increase the cross-section of the finger electrode while decreasing the contact area to decrease the wiring resistance by forming finger electrodes on the contact electrodes, and to improve the open-circuit voltage thereby. Furthermore, the inventive method for producing a solar cell can produce such solar cells without increasing the number of production steps.

DESCRIPTION OF EMBODIMENTS

Hereinafter, the present invention will be described more specifically.

As described above, it has been demanded for a back surface electrode-type solar cell with low wiring resistance and high conversion efficiency, and a method for producing a solar cell which can produce such a back surface electrode-type solar cell at low cost.

The inventors have found that the insulation regions in the present invention provided with insulator films makes it possible to shorten the distance from the end of a finger electrode to the nearest bus bar electrode, and to decrease wiring resistance of the finger electrode.

On the other hand, in view of improving an efficiency of a solar cell, it is desirable to decrease the contact area other than shortening of the foregoing distance.

Figure 20:
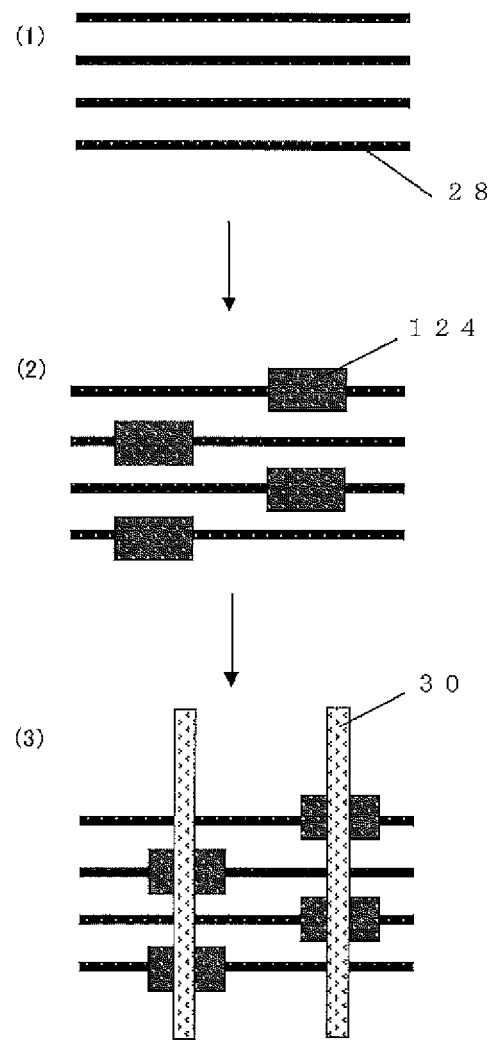
FIG. 20 is a diagram showing the steps of forming electrodes of a back surface electrode-type solar cell investigated by the present inventors.

For example, the contact area may be decreased by forming only contact electrodes each having narrow line width and bus bar electrodes as shown in FIG. 20. In this case, however, the cross-section of the finger becomes small, and the wiring resistance becomes large thereby.

Figure 21:
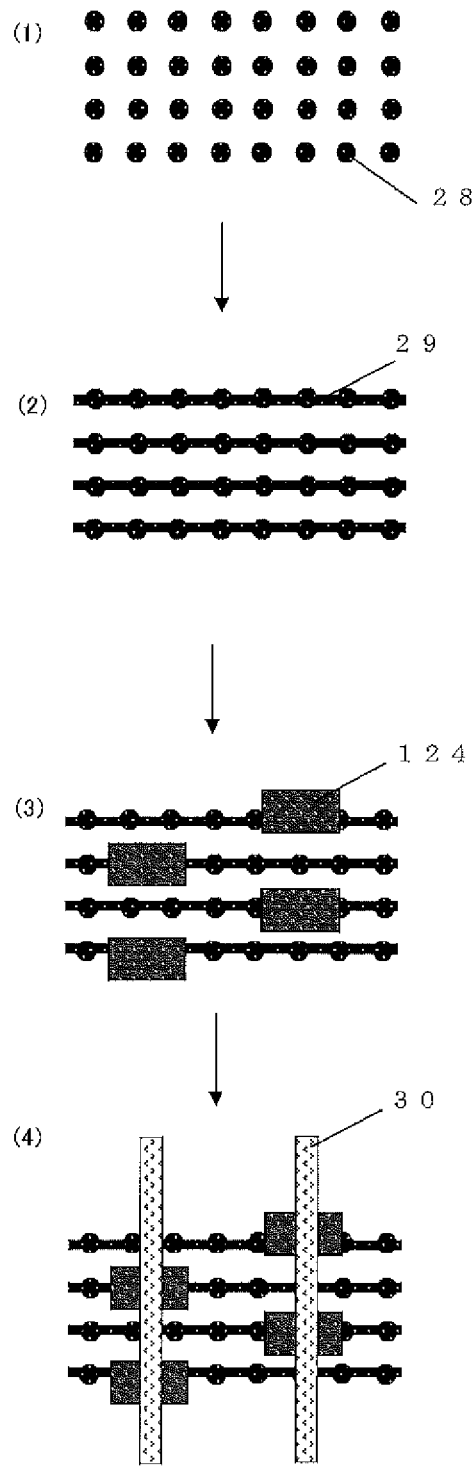
FIG. 21 is a diagram showing the steps of forming electrodes of a back surface electrode-type solar cell investigated by the present inventors.

It is also possible to form contact electrodes discontinuously in dot shapes, to form another wiring electrodes connecting these contact electrodes, and then to form bus bar electrodes as shown in FIG. 21. In this case, the increase of wiring resistance described above can be avoided, but the number of steps increases, and the cost becomes higher.

The present inventors have further investigated to solve the foregoing subject and found that by forming finger electrodes on contact electrodes, it is possible to enlarge the cross-sections of the finger electrodes while decreasing the contact area to make the wiring resistance small. The present inventors have also found that a solar cell with low wiring resistance can be produced at low cost without increasing the number of steps by a light alteration of shapes of the electrodes, that is by forming the electrode portion continuously in a line shape under the insulator film; thereby completing the solar cell and the method for producing a solar cell according to the present invention.

Hereinafter, the inventive solar cell will be specifically described with referring to figures, but the present invention is not limited thereto. It is to be noted that the following explanation mainly describes a case in which the semiconductor substrate of a first conductivity type is an N-type silicon substrate. However, even when the semiconductor substrate of a first conductivity type is a P-type silicon substrate, it only need to use an impurity source such as boron, phosphorous, etc. inversely, and does not involve any problem.

[Solar Cell (Back Surface Electrode-Type Solar Cell)]

Figure 1:
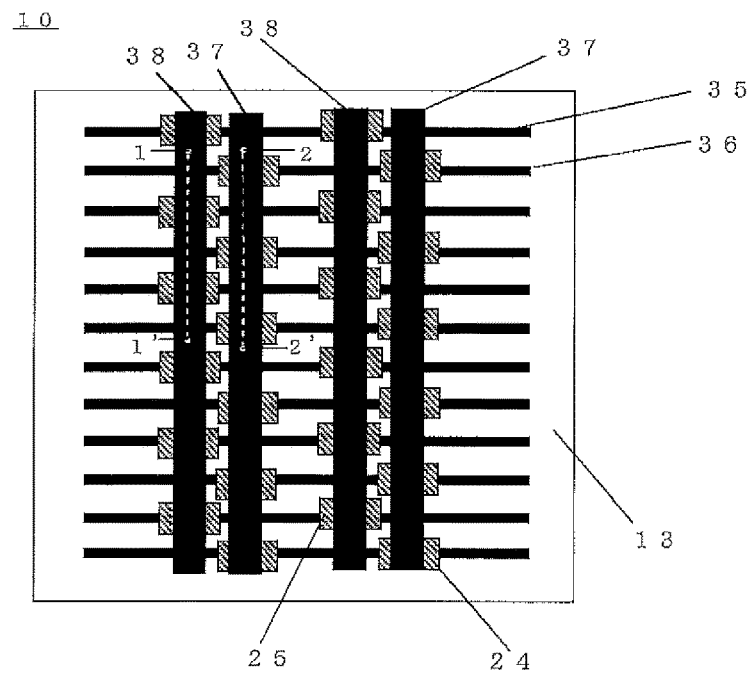
FIG. 1 is a top schematic view showing an example of the inventive solar cell.
Figure 2:
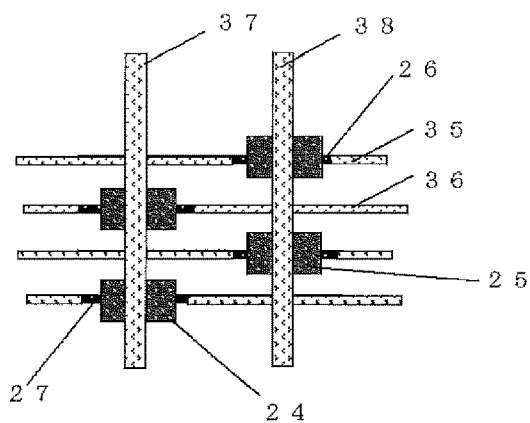
FIG. 2 is a magnified view showing an enlarged part of the inventive solar cell.
Figure 3:
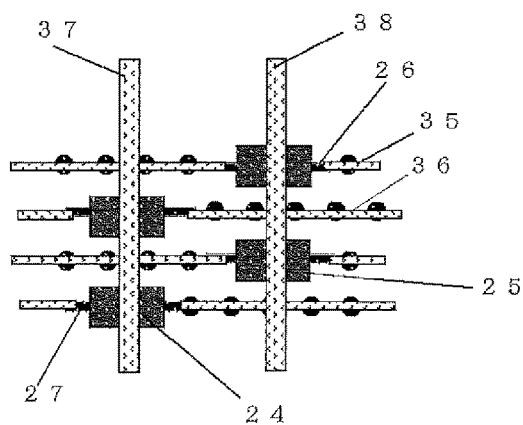
FIG. 3 is a magnified view showing an enlarged part of the inventive solar cell.
Figure 4:
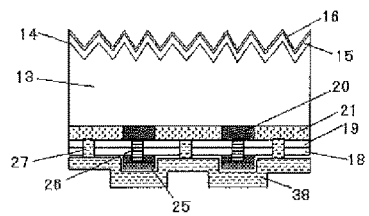
FIG. 4 is a cross sectional schematic view showing an example of the inventive solar cell.
Figure 5:
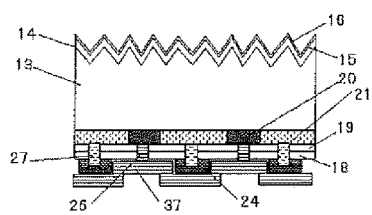
FIG. 5 is a cross sectional schematic view showing an example of the inventive solar cell.

FIG. 1 is a top schematic view showing an example of the inventive solar cell. FIGS. 2 and 3 are magnified views each showing an enlarged part of the inventive solar cell. FIGS. 4 and 5 are cross sectional schematic views each showing an example of the inventive solar cell. Incidentally, FIG. 4 is a cross sectional view with respect to the 1-1' in FIG. 1. FIG. 5 is a cross sectional view with respect to the 2-2' in FIG. 1.

As shown in FIGS. 4 and 5, the inventive solar cell is a solar cell in which a first conductivity type diffusion layer 20 and a second conductivity type diffusion layer 21 are formed on a backside of a light-receiving surface (hereinafter, also referred to as a backside simply) of a semiconductor substrate 13 of the first conductivity type, so-called a back surface electrode-type solar cell. It is further provided with a first electrode portion 26 joined to the first conductivity type diffusion layer 20, and a second electrode portion 27 joined to the second conductivity type diffusion layer as shown in FIGS. 4 and 5.

As shown in FIGS. 1 to 3, the inventive solar cell 10 is provided with a first electrode line portion 35 formed on the first electrode portion 26, a second electrode line portion 36 formed on the second electrode portion 27, a first electrode bus bar portion 37 connected with the first electrode line portion 35, and a second electrode bus bar portion 38 connected with the second electrode line portion 36.

As shown in FIGS. 4 and 5, it is possible to form a rugged shape 14 on the light-receiving surface side of the semiconductor substrate 13 of a first conductivity type, and to form an FSF layer (N-type diffusion layer) 15 thereon. Over the rugged shape 14, it is possible to form an antireflective film 16 which contains silicon nitride, etc. A dielectric passivation layer (not shown in the figures) can be formed between the FSF layer 15 and the antireflective film 16.

On the backside of the semiconductor substrate 13 of a first conductivity type, an oxide layer (a first backside passivation film) 19 can be formed. It is also possible to form a second backside passivation film 18 on the oxide layer 19. It is preferable that each of the light-receiving surface and the backside be covered with a protective layer (a passivation film). The passivation film is preferably composed of one or more materials selected from a silicon oxide film, a silicon nitride film, and an aluminum oxide film.

In the inventive solar cell 10, the first insulator film 24 is formed so as to cover the side portion and the top of the second electrode portion 27 at least in an intersection region of the second electrode portion 27 and the first electrode bus bar portion 37 as shown in FIGS. 4 and 5. Similarly, the second insulator film 25 is formed so as to cover a side portion and a top of the first electrode portion 26 at least in an intersection region of the first electrode portion 26 and the second electrode bus bar portion 38.

As shown in FIG. 5, the first electrode bus bar portion 37 can be connected with the first electrode portion 26. As shown in FIG. 4, the second electrode bus bar portion 38 can be connected with the second electrode portion 27.

As shown in FIGS. 1 to 3, the second electrode portion 27 is formed continuously in a line shape under the first insulator film 24. The first electrode portion 26 is formed continuously in a line shape under the second insulator film 25.

In such a solar cell, it is possible to form a three-dimensional structure of the bus bar electrodes and the finger electrodes by installing the insulator films in insulation regions. This makes it possible to increase the number of bus bar electrodes and to shorten the length of the finger electrodes. Accordingly, it is possible to prevent raising of wiring resistance due to the long distance from the end of the finger electrodes to the nearest bus bar electrode, which is a main reason for lowering of power of the previous large area-back surface electrode-type solar cell. As a result, it can be a solar cell with high conversion efficiency. For example, when 4 pairs (8 pieces) of bus bar electrodes are installed, the wiring resistance can be decreased to one eighth compared to the previous solar cell which is provided with one pair of bus bar electrodes at the edge of the substrate.

In the inventive solar cell, the electrode portion directly bonded to the substrate is formed continuously in a line shape under the insulator film. Accordingly, the production thereof does not need to be provided with a step of forming wiring electrodes 29 as shown in FIG. 21. Therefore, the number of production step can be decreased. As a result, it can be a solar cell with low price and high conversion efficiency.

Hereinafter, each component of the inventive solar cell will be specifically described.

[Semiconductor Substrate of First Conductivity Type]

The semiconductor substrate that can be used in the present invention is not particularly limited. For example, an N-type silicon substrate can be used. In this case, the thickness of the substrate can be a thickness of 100 to 200 µm, for example. The shape and the area of the main surface of the substrate are not particularly limited.

[Electrode Portion]

As a material for the first electrode portion 26 and the second electrode portion 27, it is possible to use a fluidal paste in which silver powder and glass frit are mixed with an organic binder (hereinafter, referred to as a sintered paste).

As described above, the electrode portion directly bonded to the substrate itself has to be formed continuously in a line shape under the insulator film, but in the other part, the shape of the electrode portion is not particularly limited. For example, it is preferable that the first electrode portion have a dot shape, a line shape, or a combination thereof in a part where the second insulator film is not formed, and the second electrode portion have a dot shape, a line shape, or a combination thereof in a part where the first insulator film is not formed. For example, if the shape of the electrode portion at the part is in a dot shape as shown in FIG. 3, the contact area can be made smaller. This makes it possible to enlarge the passivation region, and to increase the open-circuit voltage thereby.

It is to be noted that even if the electrode portion in a part where the insulator film is not formed has a line shape as shown in FIG. 2, it is possible to enlarge the cross-section (thickness) of the finger electrodes and to make a solar cell with low wiring resistance in the present invention, since the electrode line portion is formed on the electrode portion.

It is preferable that the first electrode portion formed under the second insulator film have a length larger than a length of the second insulator film, and have a width narrower than a width of the second insulator film. It is also preferable that the second electrode portion formed under the first insulator film have a length larger than a length of the first insulator film, and have a width narrower than a width of the first insulator film. When the length of the first electrode portion under the second insulator film is larger than the length of the second insulator film, or the width of the first electrode portion is narrower than the width of the second insulator film, it is possible to fully separate the second electrode bus bar portion and the first electrode portion. It is also possible to cover the side of the electrode with the insulator film. Accordingly, insulation between the second electrode bus bar portion and the first electrode portion can be securely achieved.

Herein, the electrode portion formed under the insulator film means an electrode portion formed continuously in a line shape under the insulator film, which includes a part extended from just under the insulator film and protruded from just under the insulator film. The foregoing directions of the length of the electrode portion and the length of the insulator film as well as the direction of width of the electrode bus bar portion described below in the insulation region coincide with a direction along with the longitudinal direction of the corresponding diffusion layer. The foregoing directions of the width of the electrode portion and the width of the insulator film as well as the direction of the length of the electrode bus bar portion described below coincide with a direction along with the lateral direction of the corresponding diffusion layer. The length of the electrode bus bar portion in the insulation region can be the length of the convex part of the electrode bus bar portion shown in FIGS. 4 and 5. Incidentally, the direction of the length of the convex part is the longitudinal direction of the bus bar electrode.

[Insulator Film]

The insulator film is formed so as to cover the side portion and the top of the electrode portion in the insulation region. Herein, the insulation region in the present invention means at least a spot in which an electrode portion and an electrode bus bar portion intersect with each other. The insulation region is preferably larger than the area of this spot. The shape of the insulator film is not particularly limited, and can be a rectangle, for example. Each thickness of the first insulator film and the second insulator film is preferably 1 to 60 µm, more preferably about 5 to 40 µm, much more preferably 10 to 30 µm. These thicknesses help to improve the insulation. Such insulator films, which are not formed excessively, a desired solar cell can be produced at lower cost.

It is also preferable that the first insulator film be formed so as to cover the second conductivity type diffusion layer at least a part thereof being under the first electrode bus bar portion. It is also preferable that the second insulator film is formed so as to cover the first conductivity type diffusion layer at least a part thereof being under the second electrode bus bar portion. When the back surface layer of the substrate has a dielectric layer, it is desirable to form an insulator layer larger than the width of the diffusion layer as described above. When the insulator film is larger than the width of the diffusion layer, the first electrode bus bar portion does not touch to the second conductivity type diffusion layer, and accordingly, the first electrode bus bar portion and the second conductivity type diffusion layer are not electrically conducted via the dielectric layer.

These insulator films are preferably composed of a material which contains one or more resins selected from the group consisting of silicone resins, polyimide resins, polyimide-imide resins, fluororesins, phenolic resins, melamine resins, urea resins, polyurethanes, epoxy resins, acrylic resins, polyester resins, and poval resins. Particularly, when a heat treatment is performed in forming the electrode line portion and the electrode bus bar portion, it is preferable to select a heat resistant resin. For example, siloxane bond, which is a main chain of a silicone resin, has large bond energy and is stable, thereby having superior heat resistance and weatherability compared to organic polymer materials with a main chain composed of carbon backbone. Other resins become materials with high heat resistance by introducing an aromatic ring into the molecular chain.

[Electrode Line Portion, Electrode Bus Bar Portion]

The electrode line portion and the electrode bus bar portion are preferably composed of a material which at least contains one or more kinds of conductive materials selected from the group consisting of Ag, Cu, Au, Al, Zn, In, Sn, Bi, and Pb, and one or more kinds of resins selected from the group consisting of epoxy resins, acrylic resins, polyester resins, phenolic resins, and silicone resins (hereinafter, also referred to as thermosetting paste). These electrode portion composed of such an electrode material do not have to contain glass frit, and accordingly, the electrode material does not directly touch to the semiconductor substrate such as a silicon substrate in heating, and increase of contact area can be suppressed.

The number of first electrode bus bar portion and the second electrode bus bar portion is not particularly limited, but it is preferable that the total number be 4 or more and 10 or less. This makes it possible to decrease the wiring resistance of the finger electrode, and to improve the conversion efficiency. Incidentally, the shapes of the electrode line portion and the electrode bus bar portion is not particularly limited. For example, the electrode line portion can have a continuous line shape except for the insulation region. It is to be noted that the shape of the contact electrode under the insulator film is a line shape. The electrode bus bar portion can have a continuous line shape. As shown in FIG. 1, the electrode line portion and the electrode bus bar portion can be formed so as to meet at a right angle.

It is preferable that the second electrode portion has a length of 0.35 to 5.0 mm, the first insulator film has a length of 0.32 to 4.0 mm, and the first electrode bus bar portion has a width of 0.30 to 3.0 mm in the intersection region of the second electrode portion and the first electrode bus bar portion.

It is also preferable that the first electrode portion has a length of 0.35 to 5.0 mm, the second insulator film has a length of 0.32 to 4.0 mm, and the second electrode bus bar portion has a width of 0.30 to 3.0 mm in the intersection region of the first electrode portion and the second electrode bus bar portion.

Each length of the first insulator film and the second insulator film is more preferably 0.32 to 3.0 mm. A solar cell having such an insulator film can further prevent the contact between the electrode portion and the electrode bus bar portion for different conductivity type.

It is preferable that the first electrode bus bar portion has a length of 0.3 mm or more, the first insulator film has a width of 0.03 to 1.5 mm, and the second electrode portion has a width of 0.02 to 0.20 mm in the intersection region of the second electrode portion and the first electrode bus bar portion. The upper limit of the length of the first electrode bus bar portion is not particularly limited, but it can be 2 mm, for example.

It is also preferable that the second electrode bus bar portion has a length of 0.3 mm or more, the second insulator film has a width of 0.03 to 1.5 mm, and the first electrode portion has a width of 0.02 to 0.20 mm in the intersection region of the first electrode portion and the second electrode bus bar portion. The upper limit of the length of the second electrode bus bar portion is not particularly limited, but it can be 2 mm, for example.

Such a solar cell can have the ratio of the area of the electrode to the area of the substrate within a desired range. This makes it possible to enlarge the passivation region, and to increase the open-circuit voltage, for example.

[Method for Producing Solar Cell]

The inventive method for producing a solar cell is a method for producing a solar cell in which a first conductivity type diffusion layer and a second conductivity type diffusion layer are formed on a backside of a light-receiving surface of the semiconductor substrate of the first conductivity type comprising at least the following steps.

First, the first conductivity type diffusion layer and a first electrode portion which is joined to the first conductivity type diffusion layer, as well as the second conductivity type diffusion layer and a second electrode portion which is joined to the second conductivity type diffusion layer are formed on the backside of the light-receiving surface (a step of forming electrode portions). In this step of the present invention, the second electrode portion is formed continuously in a line shape under the first insulator film in this step. The first electrode portion is also formed continuously in a line shape under the second insulator film.

Then, the first insulator film is formed so as to cover a side portion and a top of the second electrode portion, and the second insulator film is formed so as to cover a side portion and a top of the first electrode portion (a step of forming insulator films). In this step of the present invention, the first insulator film is formed at least in an intersection region of the second electrode portion and the first electrode bus bar portion. Similarly, the second insulator film is formed at least in an intersection region of the first electrode portion and the second electrode bus bar portion.

Subsequently, the first electrode line portion is formed on the first electrode portion, and the first electrode bus bar portion is formed so as to connect to the first electrode line portion. The second electrode line portion is formed on the second electrode portion, and the second electrode bus bar portion is formed so as to connect to the second electrode line portion (a step for forming electrode line portions and electrode bus bar portions). In this step of the present invention, each electrode line portion and each electrode bus bar portion (finger electrodes and bus bar electrodes) are formed simultaneously.

Such a method for producing a solar cell is excellent in productivity, and can produce a back surface electrode-type solar cell with high efficiency at low cost. It is to be noted that the step of forming electrodes can be performed by previously forming the first conductivity type diffusion layer and the second conductivity type diffusion layer successively, and then forming the first electrode portion and the second electrode portion successively as shown in FIG. 6 (*a*) to (*j*) described below; or can be performed by forming all of these diffusion layers and electrode portions simultaneously.

Hereinafter, the inventive method for producing a solar cell is specifically described with referring to figures, but the present invention is not limited thereto.

Figure 6:
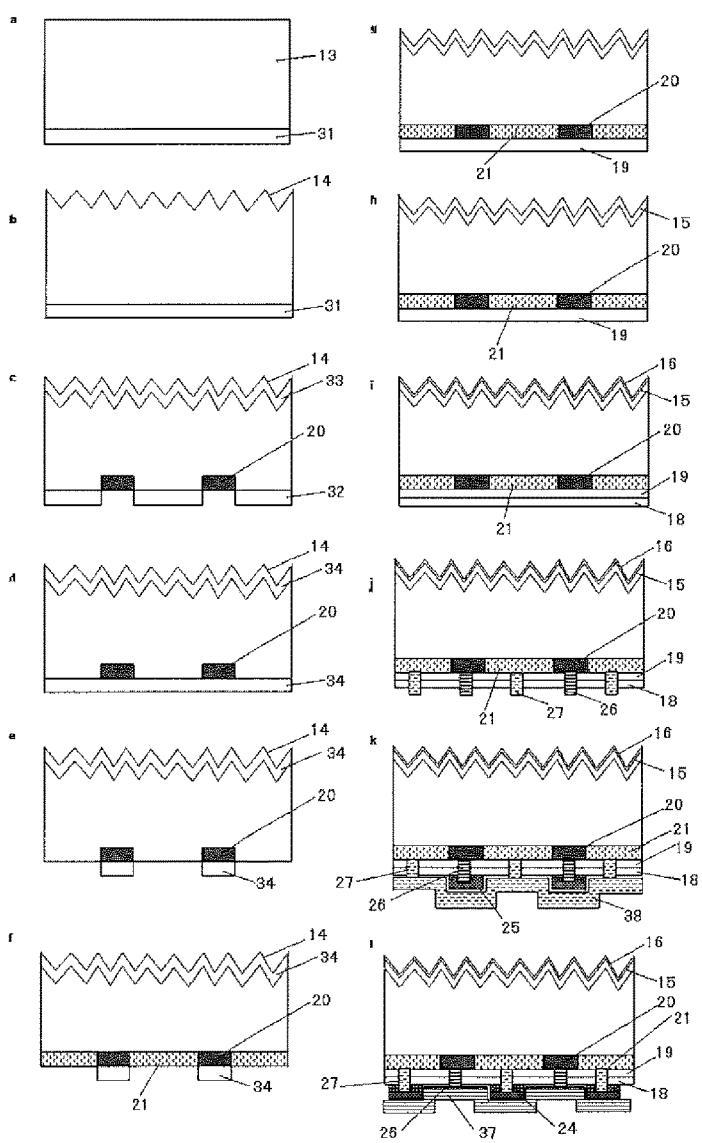
FIG. 6 is a flow diagram showing an example of the inventive method for producing a solar cell.

FIG. 6 is a flow diagram showing an example of the inventive method for producing a solar cell. Hereinafter, an example of the inventive method for producing a back surface electrode-type solar cell is described with referring to schematic cross sectional view shown in FIG. 6. Particularly, it will be described with illustrating a case of an N-type silicon substrate.

[Step for Forming Electrodes]

First, a texture mask 31 such as a silicon nitride film is formed on a backside (hereinafter, referred to as "a backside of an N-type silicon substrate"), which is a backside of a face to be a light-receiving surface of an N-type silicon substrate 13 (hereinafter, referred to as "a light-receiving surface of an N-type silicon substrate") with a thickness of 100 to 200 μm by a CVD method or a sputter method as shown in FIG. 6 (a).

Subsequently, a rugged shape 14, which is a texture structure, is formed on the light-receiving surface of the N-type silicon substrate 13 by etching as shown in FIG. 6 (b). The etching is performed, for example, by use of a solution in which isopropyl alcohol is added to an aqueous alkaline solution including sodium hydroxide or potassium hydroxide and heated to 60° C. or more and 80° C. or less.

Then, the next step will be described by use of FIG. 6 (c). After removing the texture mask 31 formed on the backside of the N-type silicon substrate 13, diffusion masks 32 and 33 such as silicon oxide films are formed on the light-receiving surface and the backside of the N-type silicon substrate 13 as shown in FIG. 6 (c). To a portion where the N-type diffusion layer will be formed, etching paste is applied by a screen printing method and so on to remove the diffusion mask 32 at the portion where the N-type diffusion layer will be formed by heat treatment, thereby exposing the substrate. The etching paste after patterning treatment is subjected to ultrasonic cleaning and removed by acid treatment. This etching paste contains at least one etching component selected from the group consisting of phosphoric acid, hydrofluoric acid, ammonium fluoride, and ammonium hydrogen fluoride, and contains water, an organic solvent and a thickener, for example. This treatment can be performed by using a photolithography method.

Thereafter, to the exposed portion on the backside of the N-type silicon substrate 13, phosphor as an N-type impurity is diffused by vapor-phase diffusion using $POCl_3$ to form an N-type diffusion layer 20. The N-type diffusion layer can be formed by spin coating of a solution in which an N-type impurity such as phosphoric acid is dissolved into alcohol or water, and performing thermal diffusion.

Subsequently, as shown in FIG. 6 (d), hydrofluoric acid treatment is performed to remove the diffusion mask 32 and the diffusion mask 33 formed on the N-type silicon substrate 13, as well as glass layers formed by diffusion of phosphorous into the diffusion masks 32 and 33, and then thermal oxidation is performed in an oxygen or a steam atmosphere to form a silicon oxide film 34.

Next, as shown in FIG. 6 (e), to a portion where a P-type diffusion layer will be formed on the backside of the N-type silicon substrate 13, etching paste is applied by a screen printing method and so on to remove the diffusion mask 34 at the portion where the P-type diffusion layer will be formed by heat treatment, thereby exposing the substrate. The etching paste after patterning treatment is subjected to ultrasonic cleaning and removed by acid treatment. This etching paste contains at least one etching component selected from the group consisting of phosphoric acid, hydrofluoric acid, ammonium fluoride, and ammonium hydrogen fluoride, and contains water, an organic solvent and a thickener, for example.

As shown in FIG. 6 (f), the backside of the N-type silicon substrate 13 is spin coated with a solution in which a P-type impurity source such as boric acid is dissolved in alcohol or water, and after drying, subjected to heat treatment to diffuse boron as a P-type impurity into the exposed portion on the backside of the N-type silicon substrate 13, thereby forming a P-type diffusion layer 21. In this case, the P-type diffusion layer 21 can also be formed by a vapor-phase diffusion method using $BBr_3$, etc.

Then, the next step is described using FIG. 6 (g). As shown in FIG. 6 (g), hydrofluoric acid treatment is performed to remove the silicon oxide film 34 formed on the N-type silicon substrate 13, and a glass layer formed by diffusion of boron into the silicon oxide film 34. Subsequently, on the backside of the N-type silicon substrate 13, a first backside passivation film 19 that doubles as a diffusion mask such as a silicon oxide film is formed by a CVD method or by applying SOG (spin on glass) and baking.

Subsequently, on the light-receiving surface of the N-type silicon substrate 13, an $n^-$ layer (an FSF layer 15), which is a light-receiving surface diffusion layer, can be formed by a method of spin coating of a solution in which N-type impurity such as phosphoric acid is dissolved in alcohol or water followed by thermal diffusion, or by a vapor-diffusion method using $POCl_3$.

On the backside of the N-type silicon substrate 13, a second backside passivation film 18 such as a nitride film is formed by CVD or a sputtering method as shown in FIG. 6 (i). The nitride film may also be formed on the front face as an antireflective film 16 by CVD or a sputtering method.

Then, as shown in FIG. 6 (j), electrodes are formed on the N-type diffusion layer 20 and the P-type diffusion layer 21 formed on the backside of the N-type silicon substrate 13.

Figure 7:
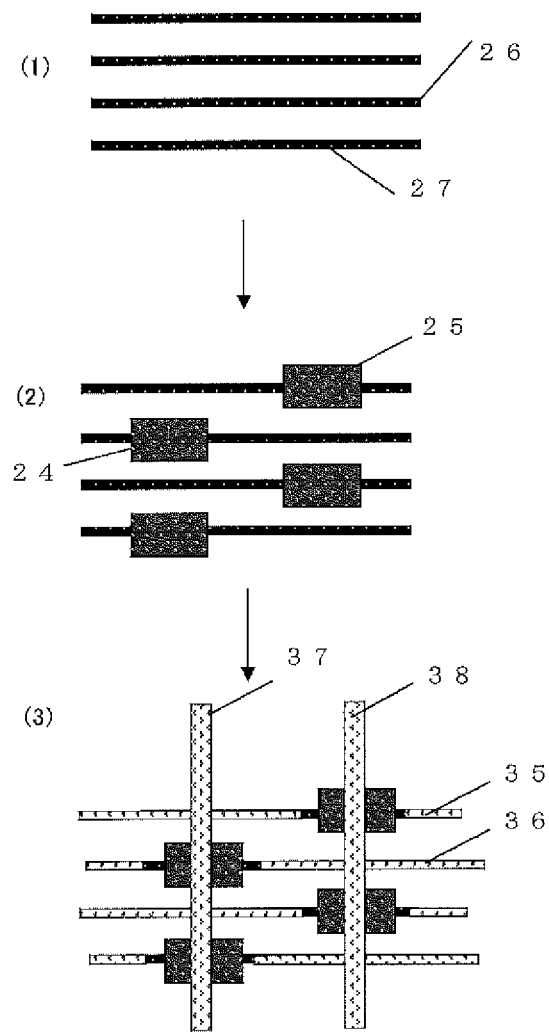
FIG. 7 is a diagram showing the steps of forming electrodes of the back surface electrode-type solar cell according to the present invention.
Figure 8:
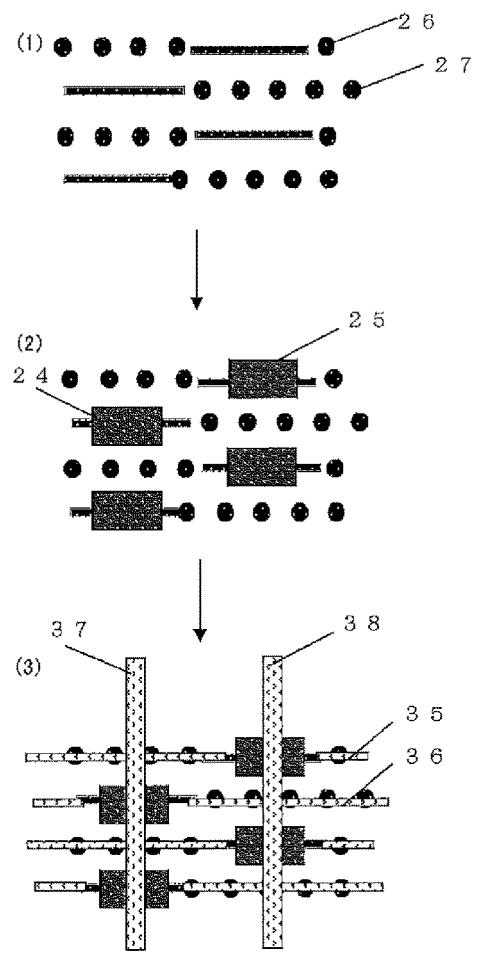
FIG. 8 is a diagram showing the steps of forming electrodes of the back surface electrode-type solar cell according to the present invention.

FIGS. 7 and 8 are diagrams showing the steps of forming electrodes of the back surface electrode-type solar cell according to the present invention. As shown in FIGS. 7 and 8, the first electrode portion 26 and the second electrode portion 27 are electrodes to form contact with the silicon substrate. Each electrode pattern of these electrode portions has to be a continuous pattern in a line shape at least in a region where the second electrode portion 27 and the first electrode bus bar portion 37 intersect, and in a region where the first electrode portion 26 and the second electrode bus bar portion 38 intersect. In other portions, it may be a discontinuous shape such as ellipses, rectangles, and dots, or may be a line shape. These shapes can coexist therein. By forming the electrode portions in line shapes in these regions, it is possible to collect current generated on the diffusion layer having the second conductivity type under the first electrode bus bar portion 37, for example, even though the electrode portion has any shape at other regions.

It is desirable that the ratio of each area of the first electrode portion and the second electrode portion based on the area of the substrate be about 1 to 6%. For example, when the distance between the finger electrodes is 1.5 mm pitch, the line width will be 14 to 90 μm. This is because a back surface electrode (an electrode portion) with smaller contact area can increase the passivation region, which allows to increase the open-circuit voltage.

It is to be noted that the width, the length, and the relative sizes of the electrode portions, the insulator films, the electrode line portions, and the electrode bus bar portions can be values described in the term of a solar cell. The material of the electrode portions, the insulator films, the electrode line portions, and the electrode bus bar portions can be the same kinds described above.

This electrode portion can be formed by screen printing, for example, using a screen plate having an opening with a pattern in a line shape and so on as described above. It can be formed by other procedures using offset printing, inkjet printing, a dispenser, a deposition method, etc.

A specific method for forming electrode portion etc. will be described with referring to FIG. 6 (j), FIG. 7, and FIG. 8.

First, sintering paste is formed on the N-type diffusion layer 20 or the P-type diffusion layer 21 by the foregoing printing method using the foregoing sintering paste as a raw material of the electrode portions. Then, the first electrode portion 26 or the second electrode portion 27 can be formed by baking this sintering paste at a temperature of 700 to 800° C. for 5 to 30 minutes (FIG. 7 (1), FIG. 8 (1)). When sintering paste containing glass frit is used as described above, the glass frit melts, while the second backside passivation film 18 and the first backside passivation film 19 melt in baking, and accordingly, the electrodes are adhered to the substrate itself so as to directly bonded thereto with penetrating these films. It is to be noted that an n$^-$ electrode and a p$^+$ electrode (the first electrode portion, the second electrode portion) can be simultaneously printed and simultaneously baked. It is also possible to perform the printing and the baking successively.

[Step for Forming Insulator Film]

Then, formation of the insulator films 24 and 25 will be described. FIG. 6 (k) is a cross sectional view of a P-type bus bar electrode, and FIG. 6 (l) is a cross sectional view of an N-type bus bar electrode. They show cross sectional views at 1-1' and 2-2' in FIG. 1, respectively.

As described above, the first insulator film is formed at least in an intersection region of the second electrode portion and the first electrode bus bar portion. Similarly, the second insulator film is formed at least in an intersection region of the first electrode portion and the second electrode bus bar portion.

As a material for the insulator film, it is possible to use the foregoing material which contains a resin such as a silicone resin. To form this material on a solar cell substrate, it is possible to use paste in which solvent is added to give fluidity (insulation paste). When it has fluidity, offset printing, screen printing, a dispenser, etc. can be used.

For example, in order to form a pattern of insulator films as shown in FIGS. 7 and 8, it is possible to use a screen plate having an opening with the same shape as this pattern. Using this screen plate, the insulator films can be formed by screen printing to apply the insulator paste onto a prescribed position on the N-type silicon substrate 13, and by performing heat treatment at 350° C. or less for 5 to 30 minutes to cure the insulator paste (FIG. 7 (2), FIG. 8 (2)). The insulator films may also be formed at desired positions by a method in which the insulator film is formed on the entire surface and then subjected to etching treatment and patterning treatment using photolithography.

[Step of Forming Electrode Line Portion and Electrode Bus Bar Portion]

Then, a method for forming the first electrode line portion 35, the second electrode line portion 36, the first electrode bus bar portion 37, and the second electrode bus bar portion 38 will be described.

As described above, in the method as shown in FIG. 20, the line width of the contact electrode becomes narrow, and accordingly, the wiring resistance becomes large. The method as shown in FIG. 21 increases the steps and raises the cost.

Accordingly, in the present invention, not only bus bar electrodes but also finger electrodes are formed simultaneously in this step (FIG. 7 (3), FIG. 8 (3)). This can decrease the wiring resistance while decreasing the number of steps.

As shown in FIGS. 7 and 8, the second electrode line portion 36 intersects the second electrode bus bar portion 38 and is connected thereto, the first electrode line portion 35 intersects the first electrode bus bar portion 37 and is connected thereto. On the other hand, the second electrode bus bar portion 38 and the first electrode line portion 35 are separated in common with the first electrode bus bar portion 37 and the second electrode line portion 36, for different conductivity type from each other. In the present invention, this separated spot contains the first electrode portion or the second electrode portion, and accordingly, the first electrode portion under the second electrode bus bar portion 38 is connected without electrical breaking. On the other hand, the second electrode portion under the first electrode bus bar portion 37 is also connected without electrical breaking.

Figure 9:
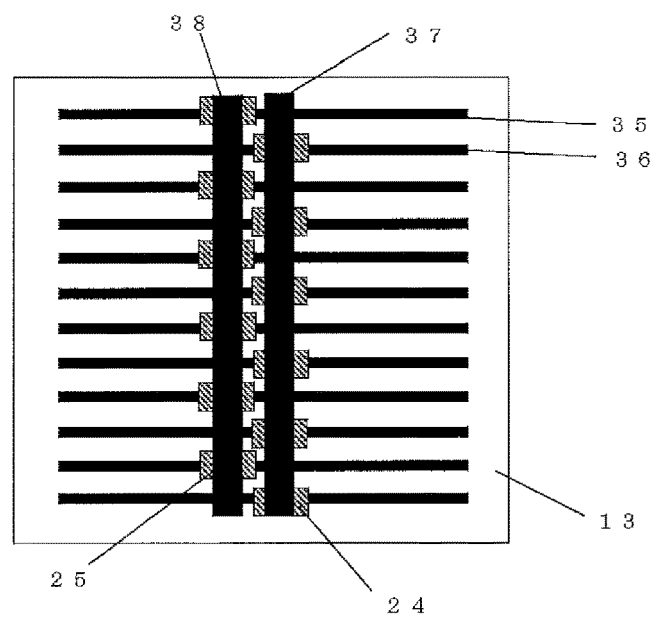
FIG. 9 is a top schematic view showing an example of the inventive solar cell.
Figure 10:
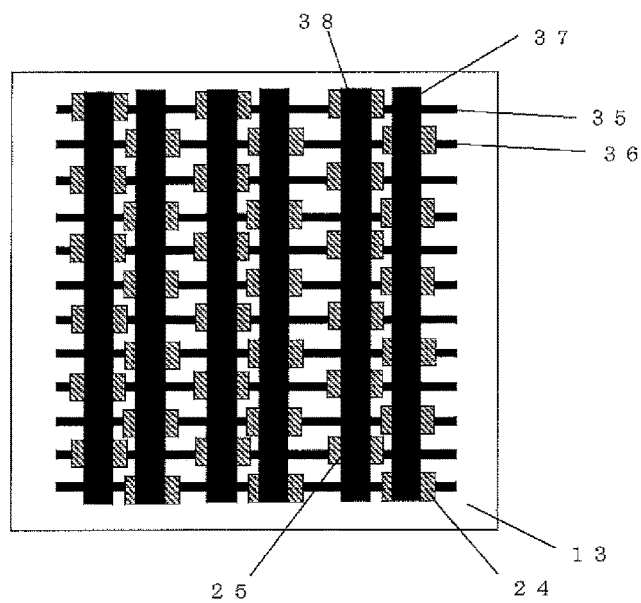
FIG. 10 is a top schematic view showing an example of the inventive solar cell.

As described above, in the previous solar cell provided with a pair of bus bar on the periphery of the substrate (FIG. 19), the length of the contact electrode becomes L based on the length L of the substrate, thereby increasing the wiring resistance. On the other hand, in the present invention, it is possible to install insulator films in the insulation regions to form three-dimensional structure of the bus bar electrodes and the finger electrodes, and accordingly, it is possible to form a bus bar electrode at a desired position. FIGS. 9 and 10 are top schematic views showing an example of the inventive solar cell. For example, in a pattern to collect current from the finger electrodes at the both sides of the bus bar electrode as shown in FIG. 9, the length of the finger electrode becomes L/2, and the wiring resistance becomes half.

In the present invention, it is also possible to install plural bus bar electrodes to shorten the finger length in order to decrease the wiring resistance. For example, the length of the finger electrodes becomes smaller such as L/4 when 2 pairs of bus bar are installed (FIG. 1), L/6 when it is 3 pairs (FIG. 10), and L/8 when it is 4 pairs.

In this case, the top of the electrode bus bar portion is soldered with Cu wiring coated with Pb—Sn and so on called tab wiring, and then the solar cell is encapsulated between glass and encapsulant to be a module so as to maintain the power even when it is subjected to outdoor exposure. Accordingly, the electrode bus bar portion may be whether continuous or discontinuous as long as it has adhesiveness with tab wiring.

As a material for the electrode line portion and the electrode bus bar portion, it is desirable to use the foregoing thermosetting paste. In order to give fluidity to this thermosetting paste, solvent can be added, for example. By adding solvent, patterning can be performed by screen printing or other printing methods.

For example, thermosetting paste having solvent added thereto is applied to a prescribed position by screen printing, and then dried, heated at 350° C. or less for 5 to 30 minutes to be cured. In this method, the thermosetting paste does not contain glass frit unlike sintering paste of the raw material of the electrode portion. Accordingly, the electrode material (the thermosetting paste) does not directly bond to the silicon substrate in heating, and the increase of contact area is suppressed. It is also possible to use such thermosetting resin paste to connect the tub wiring and the bus bar portion followed by heat treatment. This makes it possible to adhere the tab wiring and the bus bar portion without soldering.

EXAMPLES

Hereinafter, the present invention will be described in more detail with reference to Examples and Comparative Examples, but the present invention is not limited to these Examples.

Examples and Comparative Examples

In order to confirm the validity of the present invention, the following steps were performed on 90 pieces of semiconductor substrates (10 pieces for each of Examples 1 to 8 and Comparative Example 1) to produce 90 pieces of solar cells.

As shown in FIG. 6, first, on the backside of an N-type silicon substrate 13 of 15 cm square with a thickness of 200 µm, a silicon nitride film of 200 nm was formed by a CVD method to be a texture mask 31 (FIG. 6a). Subsequently, on the light-receiving surface of the N-type silicon substrate 13, texture structure (a rugged shape) 14 was formed with a solution in which isopropyl alcohol had been added to aqueous potassium hydroxide solution (FIG. 6b).

Subsequently, the texture mask 31 formed on the backside of the N-type silicon substrate 13 was removed with hydrofluoric acid solution, and then silicon oxide films were formed on the light-receiving surface and the backside of the N-type silicon substrate 13 as diffusion masks 32 and 33 by thermal oxidation. To the portions to be formed an N-type diffusion layer, etching paste mainly composed of phosphoric acid was applied by screen printing. The diffusion mask 32 was removed at the portion to be formed an N-type diffusion layer by heat treatment to expose the substrate (FIG. 6c). The etching paste after the patterning treatment was subjected to ultrasonic cleaning and removed by acid treatment. Thereafter, to the exposed portion on the backside of the N-type silicon substrate 13, phosphor as an N-type impurity was diffused by vapor-phase diffusion using POCl$_3$ to form an N-type diffusion layer 20 (FIG. 6c).

Subsequently, hydrofluoric acid treatment was performed to remove the diffusion mask 32 and the diffusion mask 33 formed on the N-type silicon substrate 13, as well as glass layers formed by diffusion of phosphorous into the diffusion masks 32 and 33, and then thermal oxidation with oxygen was performed to form a silicon oxide film 34 (FIG. 6d). Then, the silicon oxide film 34 was removed at a portion to be formed a P-type diffusion layer 21 on the backside by etching (FIG. 6e).

The backside of the N-type silicon substrate 13 was spin coated with an aqueous solution containing boric acid, and after drying, subjected to heat treatment to diffuse boron as a P-type impurity into the exposed portion on the backside of the N-type silicon substrate 13, thereby forming a P-type diffusion layer 21 (FIG. 6f).

Subsequently, as steps corresponding to FIGS. 6g to 6i, hydrofluoric acid treatment was performed to remove the silicon oxide film 34 formed on the N-type silicon substrate 13, and a glass layer formed by diffusion of boron into the silicon oxide film 34, and then silicon nitride films were formed on the front surface and the backside as passivation films by a CVD method. The procedures to this step were performed in each of Examples 1 to 8 and Comparative Example 1 as common steps. Afterward, formations of electrodes were performed.

Examples 1 to 4

In Examples 1 to 4, electrode portions, insulator films, electrode line portions, and electrode bus bar portions were each formed in a pattern shown in FIG. 7 (FIGS. 6j to 6l).

First, electrode portions were formed in a pattern of line shapes each having a width of 100 µm. Specifically, conductive paste (sintering paste) composed of Ag particles, glass frit, binder, and solvent was applied onto prescribed portions on the diffusion layer by screen printing. This was dried, and baked at 700° C. for 5 minutes to form first electrode portions and second electrode portions. Then, insulator films each having a length of 3 mm and a width of 500 µm were formed on the insulation regions. As the raw material for the insulator films, polyimide paste was used. This paste was applied onto prescribed parts by screen printing, and heated at 150° C. for 20 minutes to cure, thereby forming insulator films.

Then, finger electrodes (electrode line portions) each having a width of 100 µm and bus bar electrodes (electrode bus bar portions) each having a width of 1.2 mm were formed simultaneously. As the raw material for the electrode line portions and the electrode bus bar portions, conductive paste (thermosetting paste) composed of Ag particles and thermosetting resin was used. This thermosetting paste was applied by screen printing, dried, and heated at 200° C. for 30 minutes to cure, thereby forming the first electrode line portions, the second electrode line portions, the first electrode bus bar portions, and the second electrode bus bar portions simultaneously.

The numbers of bus bar electrodes were 1 pair in Example 1 (FIG. 9), 2 pairs in Example 2 (FIG. 1), 3 pairs in Example 3 (FIG. 10), and 4 pairs in Example 4. As shown in FIG. 7, connected portions between the bus bar electrodes and the finger electrodes were separated alternately based on the difference of the conductivity. That is, while the first electrode line portions and the first electrode bus bar portions were connected, the first electrode line portions and the second electrode bus bar portions were separated. Similarly, while the second electrode line portions and the second electrode bus bar portions were connected, the second electrode line portions and the first electrode bus bar portions were separated. The electrode line portions and the electrode portions with the same conductivity type were formed so as to connect with each other.

Examples 5 to 8

In Examples 5 to 8, electrode portions, insulator films, electrode line portions, and electrode bus bar portions were each formed in a pattern shown in FIG. 8 (FIGS. 6j to 6l).

Electrode portions with a pattern shown in FIG. 8 were formed. Each of this pattern has a diameter of 200 µm arranged along the direction to which the diffusion layer extends in a pitch distance of 0.5 mm in portions where the insulator films are not formed. This pattern also has line shapes each having a length of 4 mm and a width of 100 µm in insulation regions only. The sintering paste was applied by screen printing, dried, and baked at 700° C. for 5 minutes to form this pattern. Subsequently, insulator films each having a length of 3 mm and a width of 500 µm were formed on the insulation regions. As the raw material for the insulator films, polyimide paste was used. This paste was applied onto prescribed spots by screen printing, and heated at 150° C. for 20 minutes to cure, thereby forming insulator films.

Then, electrode line portions each having a width of 100 µm and electrode bus bar potions each having a width of 1.2 mm were formed simultaneously. The thermosetting paste was applied by screen printing, dried, and heated at 200° C. for 30 minutes to cure, thereby forming the electrode line portions and the electrode bus bar portions simultaneously.

The numbers of bus bar electrodes were 1 pair in Example 5, 2 pairs in Example 6, 3 pairs in Example 7, and 4 pairs in Example 8. As shown in FIG. 8, connected portions between the bus bar electrodes and the finger electrodes were separated alternately based on the difference of the conductivity.

Comparative Example 1

Figure 19:
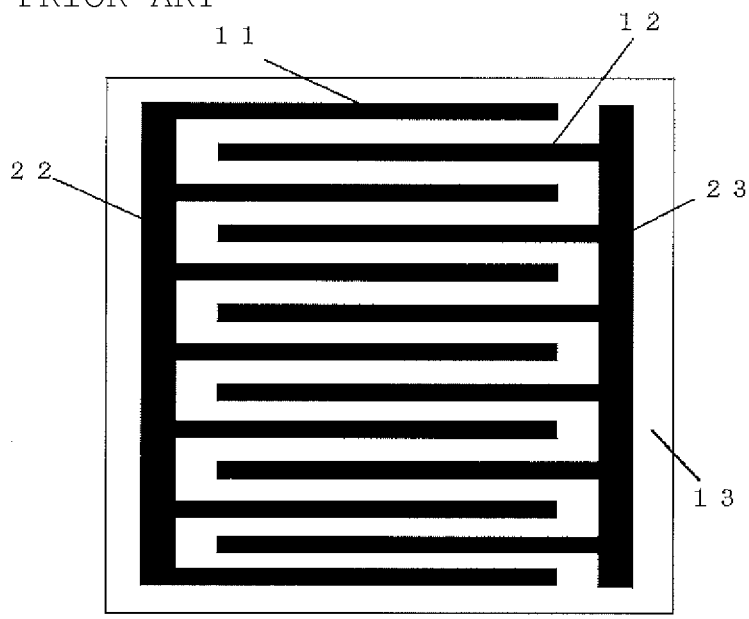
FIG. 19 is a top view schematically showing the appearance of the backside of the previous back surface electrode-type solar cell.

In Comparative Example 1, only contact electrodes and bus bar electrodes were formed. The shapes of these electrodes had a pattern which is provided with a pair of bus bar electrodes each having a width of 1.2 mm at the edge of the substrate, and contact electrodes each having a width of 100 µm extended from each bus bar electrode and installed along the direction to which the diffusion layer extends (FIG. 19). The sintering paste was applied onto the prescribed positions by screen printing, dried, and baked at 700° C. for 5 minutes.

The 90 pieces of solar cells thus produced was evaluated by using a solar simulator (in an atmosphere of 25° C., light intensity 1 kW/m$^2$, spectrum AM1.5 global). The averaged results are shown in FIGS. 11 to 14.

Figure 11:
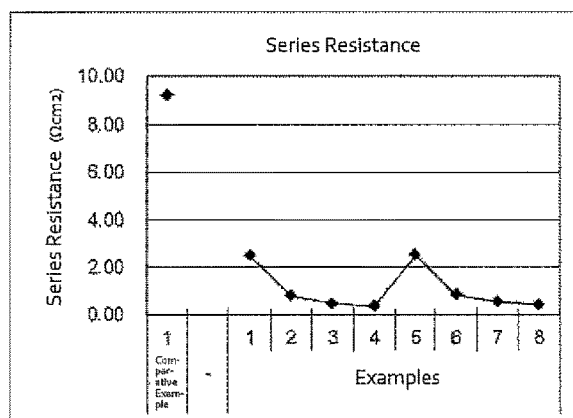
FIG. 11 is a graph showing values of series resistances of solar cells in Example 1 to 8 and Comparative Example 1.
Figure 12:
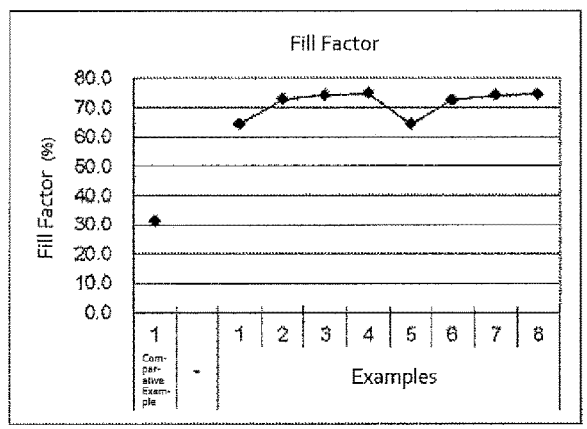
FIG. 12 is a graph showing values of fill factors of solar cells in Example 1 to 8 and Comparative Example 1.
Figure 13:
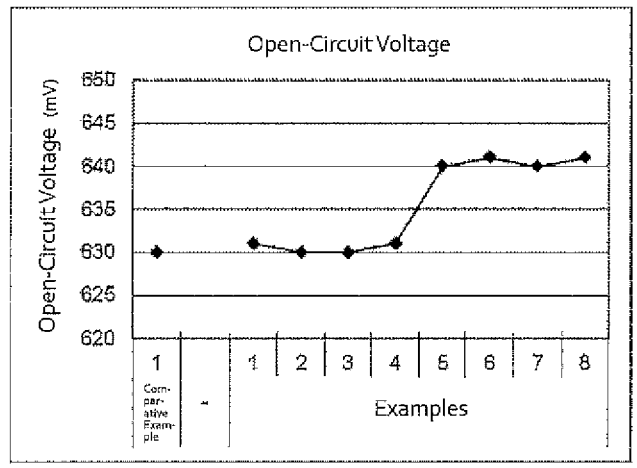
FIG. 13 is a graph showing values of open-circuit voltages of solar cells in Example 1 to 8 and Comparative Example 1.
Figure 14:
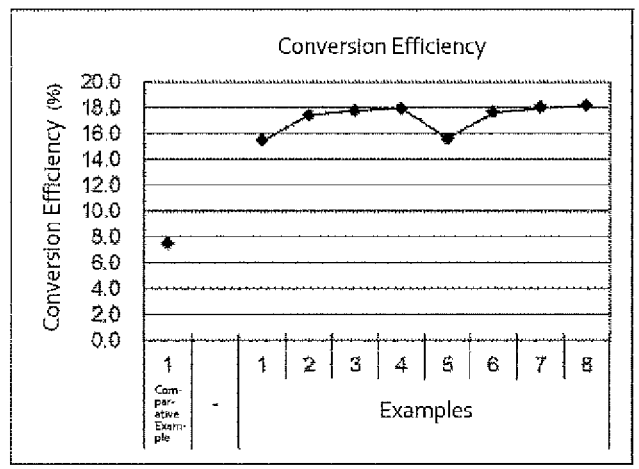
FIG. 14 is a graph showing values of conversion efficiencies of solar cells in Example 1 to 8 and Comparative Example 1.
Figure 15:
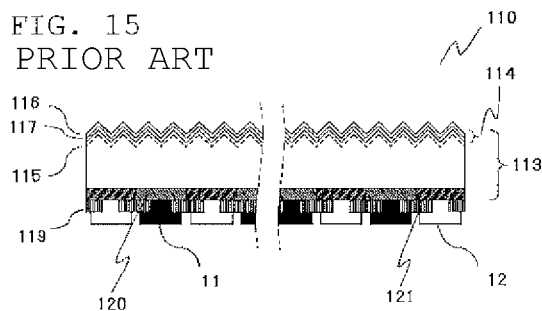
FIG. 15 is a cross sectional view schematically showing a previous back surface electrode-type solar cell.
Figure 16:
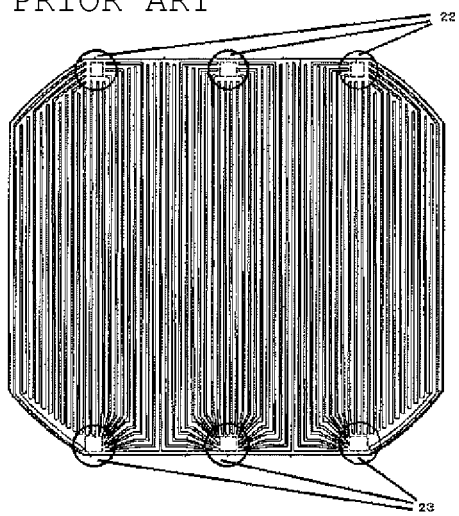
FIG. 16 is a top view schematically showing the appearance of the backside of the previous back surface electrode-type solar cell disclosed in Patent Literature 1.
Figure 17:
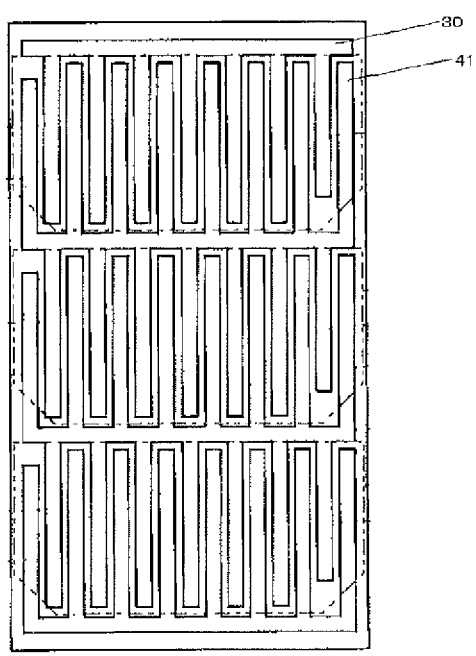
FIG. 17 is a top view schematically showing the appearance of the backside of the previous back surface electrode-type solar cell disclosed in Patent Literature 2.
Figure 18:
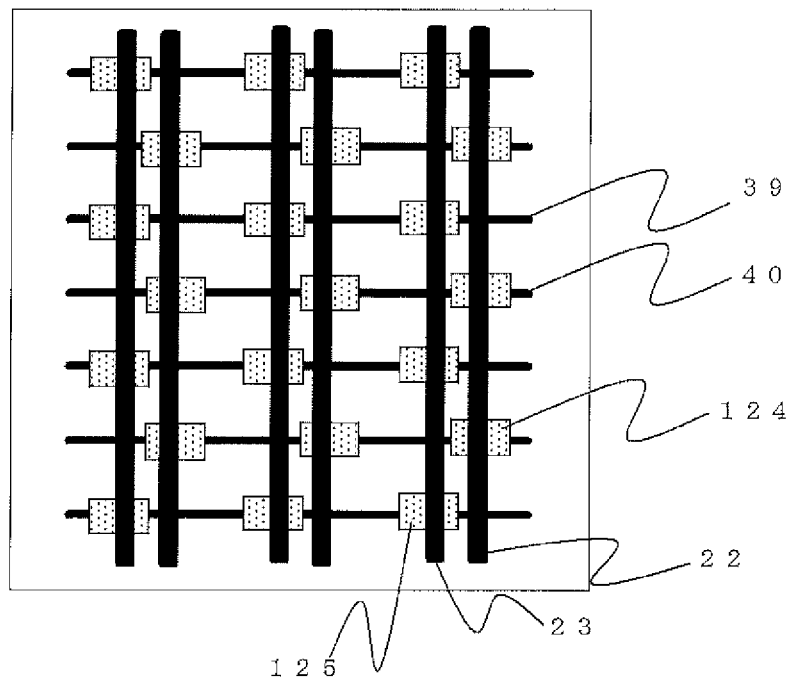
FIG. 18 is a top view schematically showing the appearance of the backside of the back surface electrode-type solar cell in which the positions of the bus bar electrodes were changed.

FIGS. 11 to 14 are graphs showing the experimental results of Example 1 to 8 and Comparative Example 1. FIG. 11 shows values of series resistances. FIG. 12 shows values of fill factors. FIG. 13 shows values of open-circuit voltages. FIG. 14 shows values of conversion efficiencies. As shown in FIGS. 11 to 14, the previous method (Comparative Example 1) showed high series resistance and lower fill factor due to the wiring resistance. On the other hand, Example 1 could have decreased contact area and enlarged cross section of the finger electrode by the three-dimensional structure of the bus bar electrodes and the finger electrodes to form finger electrodes over the contact electrodes. As a result, the wiring resistance was decreased, the fill factor was increased, and the conversion efficiency was improved. As shown in Examples 2 to 4, increases of the number of bus bar electrodes further improved the conversion efficiencies, etc. As shown in Examples 5 to 8, the electrode portions in dot shapes, which further decreased the contact area, could further improve the open-circuit voltages and the conversion efficiencies.

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A solar cell comprising:
   a semiconductor substrate of a first conductivity type having a first conductivity type diffusion layer and a second conductivity type diffusion layer which are formed on a backside of a light-receiving surface of the semiconductor substrate,
   a first electrode portion joined to the first conductivity type diffusion layer, and a second electrode portion joined to the second conductivity type diffusion layer,
   a first electrode line portion formed on the first electrode portion,
   a second electrode line portion formed on the second electrode portion,
   a first electrode bus bar portion connected with the first electrode line portion,
   a second electrode bus bar portion connected with the second electrode line portion,
   an intersection region of the second electrode portion and the first electrode bus bar portion,
   an intersection region of the first electrode portion and the second electrode bus bar portion,
   a first insulator film which is formed so as to cover a side portion and a top of the second electrode portion at least in the intersection region of the second electrode portion and the first electrode bus bar portion, and
   a second insulator film which is formed so as to cover a side portion and a top of the first electrode portion at least in the intersection region of the first electrode portion and the second electrode bus bar portion,
   wherein
   the second electrode portion is formed continuously in a line shape under the first insulator film,
   the first electrode portion is formed continuously in a line shape under the second insulator film,
   the first electrode line portion is provided on the first electrode portion except at an intersection region of the first electrode portion and the first electrode bus bar portion,
   the second electrode line portion is provided on the second electrode portion except at an intersection region of the second electrode portion and the second electrode bus bar portion, and
   the first electrode portion and the first electrode line portion constitute a first finger electrode, and the second electrode portion and the second electrode line portion constitute a second finger electrode.

2. The solar cell according to claim 1, wherein
   the first electrode portion has a dot shape, a line shape, or a combination thereof in a part where the second insulator film is not formed; and the second electrode portion has a dot shape, a line shape, or a combination thereof in a part where the first insulator film is not formed;
   the first electrode portion formed under the second insulator film has a length larger than a length of the second insulator film, and has a width narrower than a width of the second insulator film; and
   the second electrode portion formed under the first insulator film has a length larger than a length of the first insulator film, and has a width narrower than a width of the first insulator film.

3. The solar cell according to claim 2, wherein
   the first insulator film is formed so as to cover the second conductivity type diffusion layer at least in a region under the first electrode bus bar portion, and
   the second insulator film is formed so as to cover the first conductivity type diffusion layer at least in a region under the second electrode bus bar portion.

4. The solar cell according to claim 3, wherein the total number of the first electrode bus bar portion and the second electrode bus bar portion is 4 or more and 10 or less.

5. The solar cell according to claim 4, wherein the first insulator film and the second insulator film are each composed of a material which at least contains one or more resins selected from the group consisting of silicone resins, polyimide resins, polyamide-imide resins, fluororesins, phenolic resins, melamine resins, urea resins, polyurethanes, epoxy resins, acrylic resins, polyester resins, and poval resins.

6. The solar cell according to claim 3, wherein the first insulator film and the second insulator film are each composed of a material which at least contains one or more resins selected from the group consisting of silicone resins, polyimide resins, polyamide-imide resins, fluororesins, phenolic resins, melamine resins, urea resins, polyurethanes, epoxy resins, acrylic resins, polyester resins, and poval resins.

7. The solar cell according to claim 2, wherein the total number of the first electrode bus bar portion and the second electrode bus bar portion is 4 or more and 10 or less.

8. The solar cell according to claim 7, wherein the first insulator film and the second insulator film are each composed of a material which at least contains one or more resins selected from the group consisting of silicone resins, polyimide resins, polyamide-imide resins, fluororesins, phenolic resins, melamine resins, urea resins, polyurethanes, epoxy resins, acrylic resins, polyester resins, and poval resins.

9. The solar cell according to claim 2, wherein the first insulator film and the second insulator film are each composed of a material which at least contains one or more resins selected from the group consisting of silicone resins, polyimide resins, polyamide-imide resins, fluororesins, phenolic resins, melamine resins, urea resins, polyurethanes, epoxy resins, acrylic resins, polyester resins, and poval resins.

10. The solar cell according to claim 1, wherein
the first insulator film is formed so as to cover the second conductivity type diffusion layer at least in a region under the first electrode bus bar portion, and
the second insulator film is formed so as to cover the first conductivity type diffusion layer at least in a region under the second electrode bus bar portion.

11. The solar cell according to claim 10, wherein the total number of the first electrode bus bar portion and the second electrode bus bar portion is 4 or more and 10 or less.

12. The solar cell according to claim 11, wherein the first insulator film and the second insulator film are each composed of a material which at least contains one or more resins selected from the group consisting of silicone resins, polyimide resins, polyamide-imide resins, fluororesins, phenolic resins, melamine resins, urea resins, polyurethanes, epoxy resins, acrylic resins, polyester resins, and poval resins.

13. The solar cell according to claim 10, wherein the first insulator film and the second insulator film are each composed of a material which at least contains one or more resins selected from the group consisting of silicone resins, polyimide resins, polyamide-imide resins, fluororesins, phenolic resins, melamine resins, urea resins, polyurethanes, epoxy resins, acrylic resins, polyester resins, and poval resins.

14. The solar cell according to claim 1, wherein the total number of the first electrode bus bar portion and the second electrode bus bar portion is 4 or more and 10 or less.

15. The solar cell according to claim 14, wherein the first insulator film and the second insulator film are each composed of a material which at least contains one or more resins selected from the group consisting of silicone resins, polyimide resins, polyamide-imide resins, fluororesins, phenolic resins, melamine resins, urea resins, polyurethanes, epoxy resins, acrylic resins, polyester resins, and poval resins.

16. The solar cell according to claim 1, wherein the first insulator film and the second insulator film are each composed of a material which at least contains one or more resins selected from the group consisting of silicone resins, polyimide resins, polyamide-imide resins, fluororesins, phenolic resins, melamine resins, urea resins, polyurethanes, epoxy resins, acrylic resins, polyester resins, and poval resins.

17. The solar cell according to claim 1, wherein
the second electrode portion has a length of 0.35 to 5.0 mm, the first insulator film has a length of 0.32 to 4.0 mm, and the first electrode bus bar portion has a width of 0.30 to 3.0 mm in the intersection region of the second electrode portion and the first electrode bus bar portion;
the first electrode portion has a length of 0.35 to 5.0 mm, the second insulator film has a length of 0.32 to 4.0 mm, and the second electrode bus bar portion has a width of 0.30 to 3.0 mm in the intersection region of the first electrode portion and the second electrode bus bar portion.

18. The solar cell according to claim 1, wherein
the first electrode bus bar portion has a length of 0.3 mm or more, the first insulator film has a width of 0.03 to 1.5 mm, and the second electrode portion has a width of 0.02 to 0.20 mm in the intersection region of the second electrode portion and the first electrode bus bar portion;
the second electrode bus bar portion has a length of 0.3 mm or more, the second insulator film has a width of 0.03 to 1.5 mm, and the first electrode portion has a width of 0.02 to 0.20 mm in the intersection region of the first electrode portion and the second electrode bus bar portion.

19. The solar cell according to claim 1, wherein the first insulator film and the second insulator film each have a thickness of 1 to 60 µm.

20. The solar cell according to claim 1, wherein the first electrode line portion, the second electrode line portion, the first electrode bus bar portion, and the second electrode bus bar portion are each composed of a material which at least contains one or more kinds of conductive materials selected from the group consisting of Ag, Cu, Au, Al, Zn, In, Sn, Bi, and Pb, and one or more kinds of resins selected from the group consisting of epoxy resins, acrylic resins, polyester resins, phenolic resins, and silicone resins.

21. A method for producing a solar cell including a semiconductor substrate of a first conductivity type having a first conductivity type diffusion layer and a second conductivity type diffusion layer which are formed on a backside of a light-receiving surface of the semiconductor substrate, comprising the steps of:
forming the first conductivity type diffusion layer and a first electrode portion which is joined to the first conductivity type diffusion layer, as well as the second conductivity type diffusion layer and a second electrode portion which is joined to the second conductivity type diffusion layer, on the backside of the light-receiving surface;
forming a first insulator film so as to cover a side portion and a top of the second electrode portion, and forming a second insulator film so as to cover a side portion and a top of the first electrode portion; and
forming a first electrode line portion on the first electrode portion and forming a first electrode bus bar portion so as to connect to the first electrode line portion and so as to have an intersection region of the second electrode portion and the first electrode bus bar portion, simultaneously with forming a second electrode line portion on the second electrode portion and forming a second electrode bus bar portion so as to connect to the second electrode line portion and so as to have an intersection region of the first electrode portion and the second electrode bus bar portion;
wherein
the second electrode portion is formed continuously in a line shape under the first insulator film, and the first electrode portion is formed continuously in a line shape under the second insulator film in the step of forming the electrode portions;
the first insulator film is formed at least in the intersection region of the second electrode portion and the first electrode bus bar portion, and the second insulator film is formed at least in the intersection region of the first electrode portion and the second electrode bus bar portion;

the first electrode line portion is provided on the first electrode portion except at an intersection region of the first electrode portion and the first electrode bus bar portion;

the second electrode line portion is provided on the second electrode portion except at an intersection region of the second electrode portion and the second electrode bus bar portion; and the first electrode portion and the first electrode line portion constitute a first finger electrode, and the second electrode portion and the second electrode line portion constitute a second finger electrode.

* * * * *